US005622897A

United States Patent [19]

Hayes

[11] Patent Number: 5,622,897

[45] Date of Patent: Apr. 22, 1997

[54] PROCESS OF MANUFACTURING A DROP-ON-DEMAND INK JET PRINTHEAD HAVING THERMOELECTRIC TEMPERATURE CONTROL MEANS

[75] Inventor: Donald J. Hayes, Plano, Tex.

[73] Assignee: Compaq Computer Corporation, Houston, Tex.

[21] Appl. No.: 272,145

[22] Filed: Jul. 8, 1994

Related U.S. Application Data

[63] Continuation-in-part of Ser. No. 66,396, May 20, 1993, Pat. No. 5,435,060, and Ser. No. 220,835, Mar. 31, 1994.

[51] Int. Cl.[6] .......................... H01L 35/28; H01L 21/68; B41J 2/175

[52] U.S. Cl. ................................ 438/21; 347/68; 347/72; 347/14; 347/17; 347/18; 347/23; 438/55

[58] Field of Search .............................. 437/209; 347/23, 347/68, 72, 14, 17, 18

[56] References Cited

U.S. PATENT DOCUMENTS

| | | | |
|---|---|---|---|
| 4,751,528 | 6/1988 | Spehrley, Jr. et al. | 347/18 |
| 4,797,837 | 1/1989 | Brooks | 347/223 |
| 5,081,473 | 1/1992 | Hawkins et al. | 347/59 |
| 5,374,179 | 12/1994 | Swanson | 425/384 |
| 5,374,944 | 12/1994 | Janosky | 347/223 |
| 5,461,405 | 10/1995 | Lehman | 347/49 |
| 5,489,925 | 2/1996 | Brooks et al. | 347/6 |

*Primary Examiner*—John Niebling
*Assistant Examiner*—David E. Graybill
*Attorney, Agent, or Firm*—Vinson & Elkins L.L.P.

[57] ABSTRACT

A process for manufacturing a drop-on-demand ink jet printhead having thermoelectric temperature control apparatus incorporated therewith for the selective heating or cooling thereof and a method of manufacturing the same. The ink jet printhead includes a channel array constructed of a thermally conductive material, a spaced series of internal ink-carrying channels which extend rearwardly from a front side surface and a piezoelectric actuator acoustically coupled to each of the ink-carrying channels for selectively imparting pressure pulses thereto. N-type and p-type thermoelectric carriers are mounted to a top side surface of the channel array and then serially connected to a temperature controller. By applying electrical power to the n-type and p-type thermoelectric carriers, heat will be transferred between the channel array and a cover plate mounted to top side surfaces of the n-type and p-type thermoelectric carriers. In this manner, the channel array may be selectively heated or cooled.

27 Claims, 4 Drawing Sheets

PROCESS OF MANUFACTURING A DROP-ON-DEMAND INK JET PRINTHEAD HAVING THERMOELECTRIC TEMPERATURE CONTROL MEANS

CROSS-REFERENCE TO RELATED APPLICATION

This application is a Continuation-In-Part of U.S. patent application Ser. No. 08/066,396, U.S. Pat. No. 5,435,060 filed May 20, 1993 and a Continuation-In-Part of U.S. patent application Ser. No. 08/220,835 filed Mar. 31, 1994, both of which are assigned to the Assignee of the present invention and hereby incorporated by reference as if reproduced in their entirety.

BACKGROUND OF THE INVENTION

1. Field of the Invention

The present invention generally relates to ink jet printhead apparatus and, more particularly, to an ink jet printhead having thermoelectric temperature control means incorporated therein for the selective heating or cooling of the printhead.

2. Description of Related Art

A piezoelectrically actuated drop-on-demand ink jet printhead is a relatively small device used to selectively eject tiny ink droplets onto a paper sheet operatively fed through a printer, in which the printhead is incorporated, to thereby form from the ejected ink droplets selected text and/or graphics on the sheet. In one representative configuration thereof, an ink jet printhead has a horizontally spaced parallel array of internal ink-receiving channels. These internal channels are covered at their front ends by a plate member through which a spaced series of small ink discharge orifices are formed. Each channel opens outwardly through a different one of the spaced orifices.

A spaced series of internal piezoelectric sidewall portions of the printhead body separate and laterally bound the channels along their lengths. To eject an ink droplet through a selected one of the discharge orifices, the two printhead sidewall portions that laterally bound the channel associated with the selected orifice are piezoelectrically deflected into the channel and then returned to their normal undeflected positions. The driven inward deflection of the opposite channel wall portions increases the pressure of the ink within the channel sufficiently to initiate the ejection of a small quantity of ink, in droplet form, outwardly through the discharge orifice.

A drop-on-demand ink jet printhead such as that described herein could be further enhanced if provided with the ability to control its temperature, particularly if the printhead could both selectively raise and lower its operating temperature. More specifically, both the active piezoelectric material used to form sidewall actuators for the ink-carrying channels of the printhead, as well as the ink which fills those channels, are sensitive to temperature changes. Specifically, performance of the piezoelectric material, i.e. the extent to which the piezoelectric material deforms in response to the application of a voltage thereto, will begin to vary if the temperature of the piezoelectric material strays outside of a preferred range. This causes the magnitude of the pressure pulse imparted to the ink contained in an actuated channel to vary from that expected. As the size of the droplet ejected from an actuated channel will vary depending on the magnitude of the pressure pulse, spot size, i.e. the size of an ink spot produced when the ejected droplet strikes a physical medium such as a sheet of paper, will become unpredictable. As a result, the quality of the representation produced using the above described printing process will be degraded.

Similarly, variations in printhead temperature may cause problems with the ink which fills the channels of the printhead. For example, it is contemplated that, in one application of the disclosed printhead, phase change ink will be used. Typically, phase change ink is solid at room temperature. As such, it is necessary that it be heated above room temperature before it will flow effectively from the supply source to and through the small channels within the printhead. Furthermore, once supplied to the channels, it must be maintained at the elevated temperature to prevent a partial or total return to the solid state and thereby ensure that the printhead will be able to properly eject a droplet of ink upon demand. For example, should the temperature of the ink drop such that a solid particle of ink is formed, that particle could adversely affect operation of the printhead in many of the same ways that foreign particulate matter affects the printhead, for example, by clogging an ink ejection orifice associated with a channel of the printhead. Even minor variations in temperature could potentially result in a change in the viscosity of the ink sufficient to cause a modification of the operating characteristics of the printhead.

While a device or system, either separate to or incorporated therewith, for lowering the temperature of a drop-on-demand ink jet printhead is not known by us, several heating systems which elevate temperature and are suitable for use with ink jet printhead apparatus are known. In many of these configurations, the ink supply and the printhead itself are separate units. In these configurations, the ink is heated by an external heating apparatus positioned on both the ink supply source and the printhead itself. The ink, most commonly, the aforementioned phase change ink, is heated sufficiently to achieve a liquefied ink that will easily flow through the entire printhead ink distribution system. After the ink has been sufficiently heated at the supply source, the ink is transferred from the supply source to the printhead that is heated by an external heating apparatus. The heated printhead maintains the ink's liquidity so that it will flow freely though the small printhead channels and orifices. The ink is then ejected from the printhead onto the paper. In those configurations where the ink supply source and the printhead are one unit, the entire unit is heated by a single external heating apparatus.

In view of the foregoing it can readily be seen that it would be desirable to provide a drop-on-demand ink jet printhead having temperature control means configured to both selectively heat and cool the printhead and a method of manufacturing a printhead having the aforementioned temperature control means incorporated therewith.

It is accordingly an object of the present invention to provide such a printhead and associated method of manufacture.

SUMMARY OF THE INVENTION

In one embodiment, the present invention is of a method of manufacturing a drop-on-demand ink jet printhead in which a channel array constructed of a thermally conductive material and having a top side surface, a front side surface, a spaced series of internal ink-carrying channels which extend rearwardly from the front side surface and piezoelectric actuation means acoustically coupled to each of the ink-carrying channels for selectively imparting pressure pulses thereto is first provided. To complete assembly, thermoelectric temperature control means, which includes means for heating and cooling the channel array, are mounted to the top side surface of the channel array. In one aspect thereof, the thermoelectric temperature control means are mounted to the top side surface of the channel array by providing a plurality of n-type and p-type thermoelectric carriers and thermoconductively mounting bottom side surfaces of each one of the plurality of n-type and p-type thermoelectric carriers to the top side surface of the channel array. A bottom side surface of a thermally conductive cover plate is then thermoconductively mounted to the top side surface of each one of the plurality of n-type and p-type thermoelectric carriers. The plurality of n-type and p-type thermoelectric carriers are then serially connected to a power source such that application of a first current causes the plurality of n-type and p-type thermoelectric carriers to cool the channel array by transferring heat from the channel array to the cover plate while application of a second, reverse, current causes the plurality of n-type and p-type thermoelectric carriers to heat the channel array by transferring heat from the cover plate to the channel array.

In further aspects thereof, a first plurality of electrodes are formed on the top side surface of the channel array for electrical connection with n-type and p-type thermoelectric carriers, a second plurality of electrodes are formed on the bottom side surface of the cover plate, again for electrical connection with n-type and p-type thermoelectric carriers, a third plurality of electrodes are formed on the top side surface of the channel array for electrical connection with respective single ones of a second plurality of thermoelectric carriers thermoconductively mounted on the top side surface and a fourth plurality of electrodes are formed on the bottom side surface of the cover plate, again for electrical connection with respective single ones of the second plurality of thermoelectric carriers. Preferably, the third plurality of electrodes extend to a rear edge of the top side surface of the channel array where they are electrically connected to the power source while the fourth plurality of electrodes extend to a front edge of the bottom side surface of the cover plate, again where they are electrically connected to the power source. In a still further aspect thereof, a thermocouple is mounted to the channel array and electrically connected to the power source. In this aspect, the power source selectively applies the first or second current to selectively cool or heat the channel array based upon the channel array's temperature as determined by the thermocouple.

In an alternate aspect of this embodiment of the invention, a first plurality of electrodes are formed on the top side surface of the channel array as a first series of generally parallel rows which extend thereacross such that a first electrode in each of the rows has a leading edge spaced a first distance from a front edge of the top side surface and a last electrode in each of the rows extends to a rear edge of the top side surface. A plurality of n-type and p-type thermoelectric carrier pairs are electrically connected with corresponding ones of the first plurality of electrodes other than the last electrode in each of the rows such that, for each of the rows, the n-type and p-type thermoelectric carrier pairs are arranged in an alternating pattern and a single thermoelectric carrier is electrically connected with the last electrode in each of the rows. A second plurality of electrodes are formed on the bottom side surface of the cover plate as a second series of generally parallel rows which extend across the bottom side surface. A first electrode in each of the rows of the second series of rows extends to a front edge of the bottom side surface and a last electrode in each of the rows of the second series of rows has a trailing edge spaced a second distance from a rear edge of the bottom side surface.

In this embodiment, each one of the second plurality of electrodes other than the first electrode in each of the second series of rows are electrically connected with an n-type thermoelectric carrier of a first n-type and p-type thermoelectric carrier pair and a p-type thermoelectric carrier of a second n-type and p-type thermoelectric carrier pair while the first electrode in each of the rows of the second series of rows is electrically connected with a single thermoelectric carrier of one of the n-type and p-type thermoelectric carrier pairs. Preferably, the electrodes formed on the top side surface of the channel array which extend to the rear edge thereof are electrically connected to a first side of the power source while the electrodes formed on the bottom side surface of the cover plate which extend to the front edge thereof are electrically connected to a second side of the power source. As before, a thermocouple may be mounted to the channel array and electrically connected to the power source such that the power source selectively applies the first or second current to selectively cool or heat the channel array based upon the channel array's temperature as determined by the thermocouple.

In an alternate embodiment thereof, the channel array for the ink jet printhead may be manufactured by providing an insulative lower body portion having a plurality of generally parallel, longitudinally extending strips of conductive material formed along a top side surface, a corresponding plurality of conductive pins projecting from a bottom side surface and means for electrically connecting each of the pins with a corresponding one of the strips is provided. A bottom side surface of a first active intermediate body portion poled in a first direction generally parallel to the lower body portion is conductively mounted to the top side surface of the lower body portion and a bottom side surface of a second active intermediate body portion poled in a second, opposite, direction is conductively mounted to a top side surface of the first active intermediate body portion.

In this embodiment, a plurality of generally parallel, longitudinally extending grooves which extend through the first and second intermediate body portions to expose generally parallel, longitudinally extending portions of the top side surface of the lower body portion located between the strips of conductive material are then formed at spaced locations along a top side surface of the second intermediate body portion. A bottom side surface of an insulative upper body portion is then conductively mounted to the top side surface of the second intermediate body portion. In a particular aspect of this embodiment of the invention, a controller which controls the application of voltage to the first and second intermediate body portions may then be mounted to the plurality of conductive pins projecting from the bottom side surface of the lower body portion.

In yet another embodiment, the present invention is of a drop-on-demand ink jet printhead comprised of a channel array having a plurality of ink-carrying channels which extend rearwardly from a front side surface thereof, piezoelectric actuation means acoustically coupled to each of the plurality of ink-carrying channels and thermoelectric temperature control means thermoconductively mounted to a top side surface of the channel array. In one aspect thereof, the thermoelectric temperature control means is comprised of a plurality of n-type and p-type thermoelectric carriers, each having a lower side surface thermoconductively mounted to the top side surface of the channel array, and a cover plate constructed of a thermally conductive material and having a bottom side surface thermoconductively mounted to a top side surface of each of the plurality of n-type and p-type thermoelectric carriers.

In an alternate aspect thereof, the thermoelectric temperature control means is comprised of a first plurality of electrically conductive strips formed on the top side surface of the channel array and a plurality of thermoelectric carrier pairs, each comprised of an n-type thermoelectric carrier and a p-type thermoelectric carrier, thermoconductively mounted to the top side surface of the channel array such that each of the thermoelectric carrier pairs is in electrical contact with a corresponding one of the plurality of conductive strips. A lower side surface of a thermally conductive cover plate is thermoconductively mounted to each one of the n-type and p-type thermoelectric carriers and a second plurality of electrically conductive strips are formed on the lower side surface of the cover plate such that each one of the second plurality of electrically conductive strips electrically contacts the n-type thermoelectric carrier of a first thermoelectric carrier pair and the p-type thermoelectric carrier of a second thermoelectric carrier pair. Means for serially connecting the plurality of thermoelectric carrier pairs to a power source are also provided.

In an alternate embodiment thereof, the channel array for the ink jet printhead may be comprised of a lower body portion having a plurality of conductive sections mounted to a top side of the lower body portion and a corresponding plurality of conductive pins projecting from a bottom side of the lower body portion. Each of the conductive sections is electrically connected to the corresponding one of the conductive pins. A bottom side surface of each one of a plurality of generally parallel, longitudinally extending first intermediate body portions, each formed of an active piezoelectric material poled in a first direction parallel to the top side surface of the lower body portion, is conductively mounted to a portion of the top side surface of the lower body portion. A bottom side surface of each one of a plurality of generally parallel, longitudinally extending second intermediate body portions, each formed of an active piezoelectric material poled in a second direction opposite to the first direction, is conductively mounted to a top side surface of a corresponding one of the first intermediate body portions. A bottom side surface of an insulative upper body portion is then conductively mounted to a top side surface of each of the plurality of second intermediate body portions. In a particular aspect of this embodiment of the invention, a controller which controls the application of voltage to the first and second intermediate body portions may then be mounted to the plurality of conductive pins projecting from the bottom side surface of the lower body portion.

In yet another embodiment, the present invention is of a method of manufacturing a drop-on-demand ink jet printhead in which thermally conductive lower and upper body portions of a channel array are provided. Thermoelectric temperature control means are mounted to a top side surface of the upper body portion and the lower and upper body portions mated to form a channel array having a spaced series of internal ink-carrying channels which extend rearwardly from front side surfaces of the lower and upper body portions. In one aspect thereof, thermoelectric temperature control means are mounted to the top side surface of the upper body portion by providing a plurality of n-type and p-type thermoelectric carriers, thermoconductively mounting a bottom side surface of each one of the plurality of n-type and p-type thermoelectric carriers to the top side surface of the upper body portion and thermoconductively mounting a bottom side surface of a thermally conductive cover plate to the top side surface of each one of the plurality of n-type and p-type thermoelectric carriers.

In a further aspect thereof, the bottom side surface of each one of the plurality of n-type and p-type thermoelectric carriers are mounted to the top side surface of the upper body portion by forming a first plurality of electrodes on the top side surface of the upper body portion and electrically connecting an n-type thermoelectric carrier and a p-type thermoelectric carrier with each one of the first plurality of electrodes. The bottom side surface of the cover plate is then thermoconductively mounted to the top side surface of each one of the plurality of n-type and p-type thermoelectric carriers by forming a second plurality of electrodes on the bottom side surface of the cover plate and electrically connecting each one of the second plurality of electrodes with an n-type thermoelectric carrier and a p-type thermoelectric carrier.

In still further aspects thereof, third and fourth plurality of electrodes may be respectively formed on the top side surface of the channel array and the bottom side surface of the cover plate. The third plurality of electrodes extend to a rear edge of the top side surface and the fourth plurality of electrodes extend to a front edge of the bottom side surface. A second plurality of thermoelectric carriers are then mounted on the top side surface such that a single one of the second plurality of thermoelectric carriers is electrically connected with one of the third plurality of electrodes.

In another embodiment, the present invention is a method of manufacturing a drop-on-demand ink jet printhead in which thermally conductive lower and upper body portions of a channel array are provided. A first plurality of electrodes are formed on a top side surface of the upper body portion array and a bottom side surface of the upper body portion is mated with a top side surface of the lower body portion to form a channel array having a spaced series of internal ink-carrying channels which extend rearwardly from front side surfaces of the lower and upper body portions. Thermoelectric temperature control means, which includes means for heating and cooling the channel array, are then mounted to the top side surface of the upper body portion by electrically connecting it with the first plurality of electrodes formed on the top side surface of the channel array. In one aspect thereof, the thermoelectric temperature control means is electrically connected with the first plurality of electrodes by providing a plurality of n-type and p-type thermoelectric carriers and thermoconductively mounting bottom side surfaces of each one of the plurality of n-type and p-type thermoelectric carriers to the top side surface of the upper body portion such that an n-type thermoelectric carrier and a p-type thermoelectric carrier are electrically connected with each one of the first plurality of electrodes. A bottom side surface of a thermally conductive cover plate is then thermoconductively mounted to the top side surface of each one of the plurality of n-type and p-type thermoelectric carriers. The plurality of n-type and p-type thermoelectric carriers are then serially connected to a power source such that application of a first current causes the plurality of n-type and p-type thermoelectric carriers to cool the channel array by transferring heat from the channel array to the cover plate while application of a second, reverse, current causes the plurality of n-type and p-type thermoelectric carriers to heat the channel array by transferring heat from the cover plate to the channel array.

In further aspects thereof, a second plurality of electrodes are formed on the bottom side surface of the cover plate, again for electrical connection with n-type and p-type thermoelectric carriers, a third plurality of electrodes are formed on the top side surface of the upper body portion for electrical connection with respective single ones of a second plurality of thermoelectric carriers thermoconductively mounted on the top side surface and a fourth plurality of electrodes are formed on the bottom side surface of the cover plate, again for electrical connection with respective single ones of the second plurality of thermoelectric carriers. The third plurality of electrodes are formed on the top side surface of the upper body portion prior to the mating of the upper and lower body portions and preferably extend to a rear edge of the top side surface of the upper body portion where they are electrically connected to the power source while the fourth plurality of electrodes extend to a front edge of the bottom side surface of the cover plate, again where they are electrically connected to the power source.

DETAILED DESCRIPTION

Figure 1A:
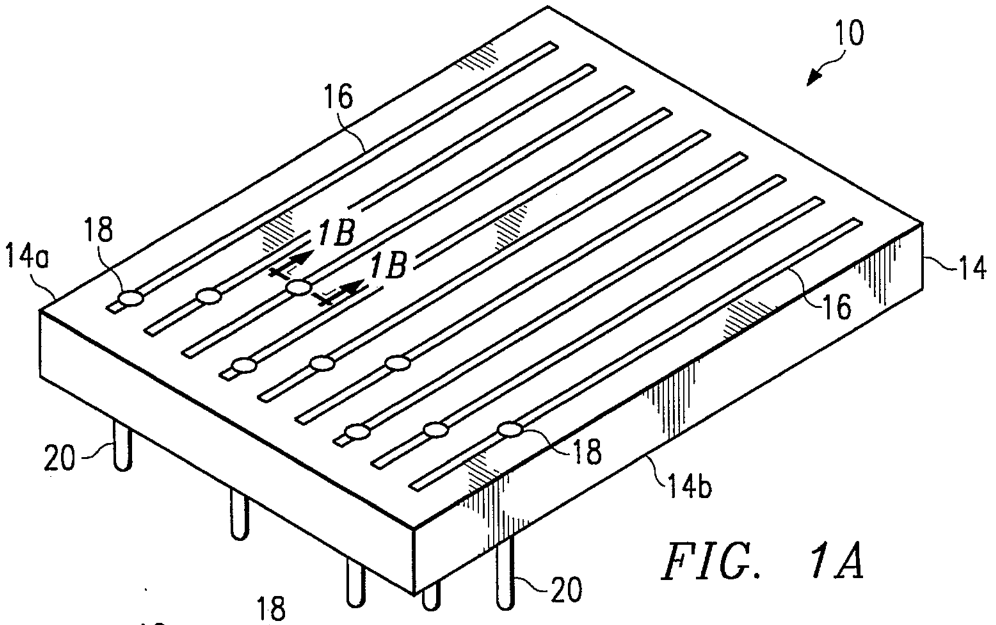
FIG. 1A is a perspective view of a lower body portion of a drop-on-demand ink jet printhead.

Referring first to FIG. 1A, a lower body portion 10 of an ink jet printhead 12 interconnectable with an associated drive system from a lower side thereof and having thermoelectric temperature control means 11 mounted to a top side surface thereof may now be seen. The lower body portion 10 includes a base portion 14 formed from a block of patternable insulative material, for example, a block of fotoceram material. Formed on a top side surface 14*a* of the base portion 14 are a series of generally parallel, longitudinally extending strips 16, each formed of a conductive material such as metal. As will be more fully described below, each strip 16 provides an electrical connection between an external drive system and a sidewall actuator for the ink jet printhead 12. Formed along each strip 16 is a metal plated aperture or via 18 which extends from the top side surface 14*a*, where it is electrically connected with the corresponding strip 16, to a bottom side surface 14*b* of the lower body portion 10 where it is electrically connected with a corresponding conductive pin 20. Preferably, the vias 18 are formed in a staggered pattern which produces a contact pitch easy to interconnect therewith. Furthermore, it is contemplated that all of the vias 18 may be formed in the front end of the printhead 12 so that the rear end may be used to form a manifold and internal conduit for supplying ink to the printhead 12.

As will be more fully described below, the pins 20 are used to interconnect one side of the ink jet printhead 12 with a drive system (not visible in FIG. 1A) for applying voltages to selected piezoelectric sidewall actuators of the ink jet printhead 12 to cause the deflection of the selected sidewall actuators into an ink-carrying channel partially defined by the selected sidewall actuators, thereby imparting a compressive pressure pulse capable of initiating the ejection of a droplet of ink therefrom.

Figure 1B:
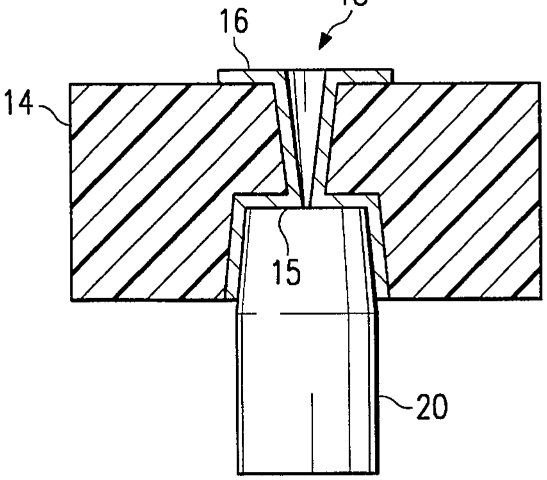
FIG. 1B is a cross-sectional view taken along lines 1B—1B of FIG. 1A which illustrates the structure for interconnecting the ink jet printhead with an associated drive system.
Figure 2:
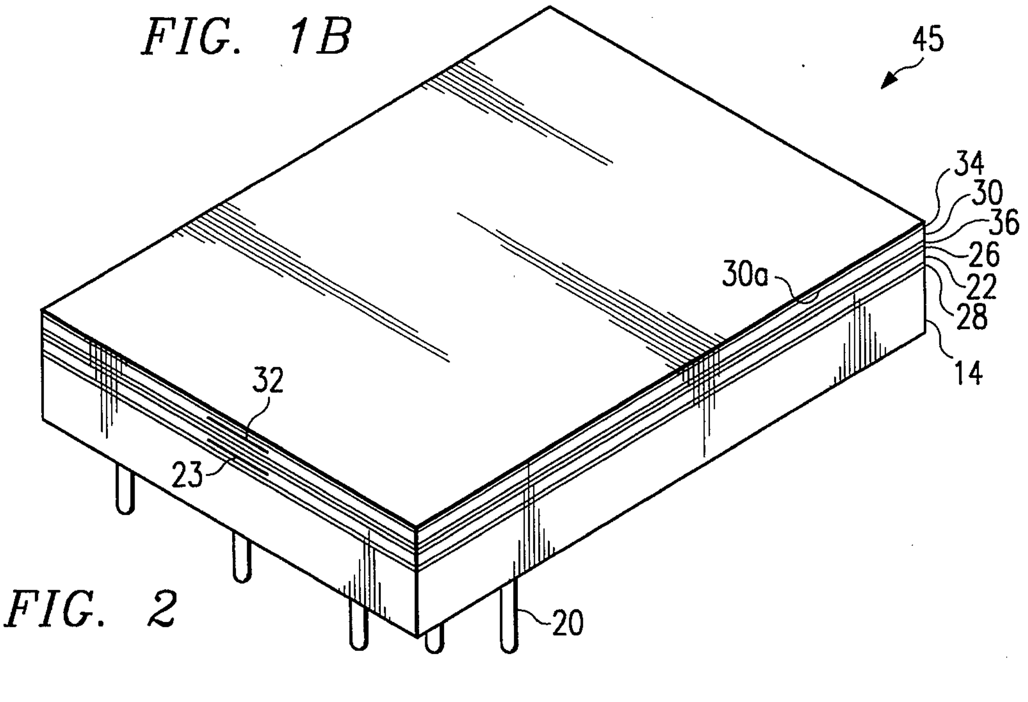
FIG. 2 is a perspective view of the lower body portion of FIG. 1A after first and second intermediate body portions have been conductively mounted thereto.

Referring next to FIG. 1B, a cross-section taken across line 1B—1B of FIG. 1A illustrates the electrical interconnection of a conductive strip 16 with a corresponding conductive pin 20. As may now be seen, each conductive pin 20 is insertably mounted in a corresponding aperture 18, for example, using a soldering process, such that each pin 20 engages conductive plate 15 formed along an inner side surface of the corresponding aperture 18 and electrically connected to the corresponding conductive strip 16. In this manner, each pin 20 is electrically connected to a corresponding strip 16 of conductive material.

Referring next to FIGS. 1A and 2–4, a method of manufacturing a channel array 45 for the ink jet printhead 12 will now be described in greater detail. Starting with the lower body portion 10, a first intermediate body portion 22 constructed of an active piezoelectric material, for example, lead zirconate titante (or "PZT"), poled in a first direction 23 generally parallel to the lower body portion 10, and having first and second layers 26, 28 of a conductive material, for example, metal, mounted to top and bottom side surfaces 22*a* and 22*b*, respectively, is aligned, mated and conductively bonded, for example, using a conductive adhesive (not shown), for example, conductive epoxy, such that the conductive layer 28 is conductively mounted to the conductive strips 16. Next, a second intermediate body portion 30 constructed of an active piezoelectric material, for example, PZT, poled in a second direction 32, opposite to the first direction 23 but also parallel to the lower body portion 10, and having first and second layers 34, 36 of a conductive material, for example, metal, mounted to top and bottom side surfaces 30*a* and 30*b*, respectively, is aligned, mated and conductively bonded, again using a conductive adhesive (not shown) such as conductive epoxy, to the top side surface 22*a* of the first intermediate body portion 22.

Figure 3:
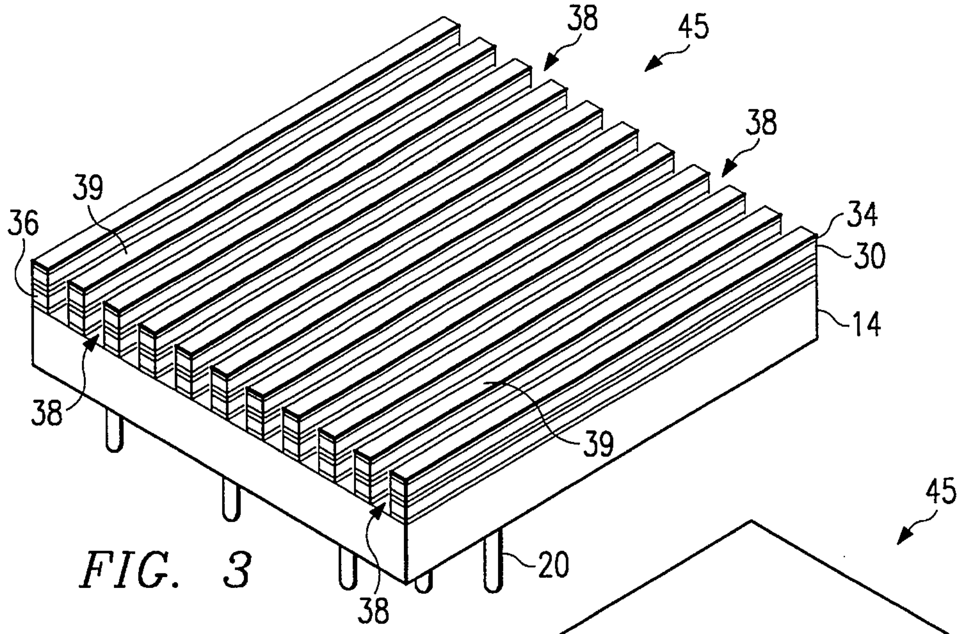
FIG. 3 is a perspective view of the lower and first and second intermediate body portions of FIG. 2 after a series of generally parallel, longitudinally extending grooves have been formed therein.

Referring next to FIG. 3, a series of longitudinally extending, generally parallel grooves 38 are formed in the channel array 45, most commonly, using a conventional diamond sawing process. Preferably, each groove 38 should be formed such that it extends through the conductive layer 34, the second intermediate body portion 30, the conductive layer 36, the conductive layer 26, the first intermediate body portion 22, the conductive layer 28 and partially through the insulative lower body portion 10 of the channel array 45. During the forming process, the grooves 38 are precisely located such that they are formed in between the longitudinally extending, generally parallel strips 16 of conductive material.

By forming the grooves 38 in this manner, a series of generally parallel, longitudinally extending piezoelectric sidewall actuators 39 are formed, preferably in a manner such that one of conductive strips 16 runs lengthwise along the longitudinal extension of one of the sidewall actuators 39 and is of a slightly lesser width than the actuator 39. It is noted that, if the grooves 38 are precisely located between the conductive strips 16, the grooves need only to extend through the conductive layer 28 and need not extend into part of the lower body portion 14 to ensure electrical isolation of each strip 16. In any event, it is strongly recommended that the grooves 38 are formed such that they extend into the lower body portion 14 for both ease of manufacture and to ensure electrical isolation of the strips in the event of a minor misalignment during the sawing process.

Figure 4:
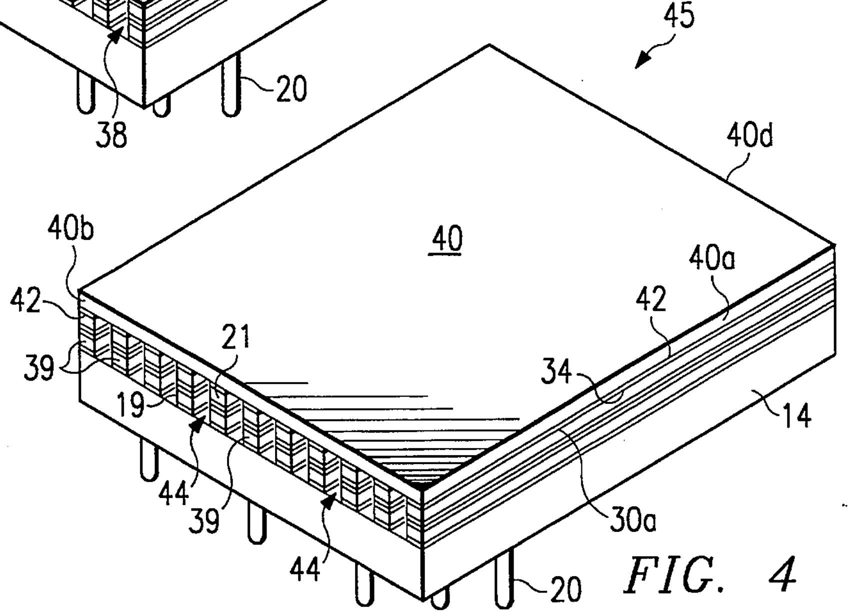
FIG. 4 is a perspective view of the grooved lower and first and second intermediate body portions of FIG. 3 after an upper body portion has been conductively mounted thereto to form a channel array for an ink jet printhead.

Referring next to FIG. 4, an upper body portion 40 constructed of an thermally conductive and electrically insulative material and having top and bottom side surfaces **40*a* and 40*b* is aligned, mated and conductively bonded, for example, using a conductive adhesive (not shown) such as conductive epoxy, to the top side surface 30*a* of the second intermediate body portion 30 such that a layer 42 of conductive material, for example, metal, formed on the bottom side surface 40*b* of the upper body portion 40 is conductively mounted to the layer 34 of conductive material formed on the top side surface 30*a* of the second intermediate body portion 30. In this manner, a plurality of longitudinally extending, generally parallel ink-carrying channels 44, each defined by part of the lower body portion 14, a first sidewall actuator 39 comprised of a section 19 of the first intermediate body portion 22 and a section 21 of a second intermediate body portion 30, part of the upper body portion 40 and a second sidewall actuator 39, similarly comprised of a section 19 of the first intermediate body portion 22 and a section 21 of the second intermediate body portion 22, are formed. The assembly of a channel array 45 for the ink jet printhead 12** is now complete.

Figure 5:
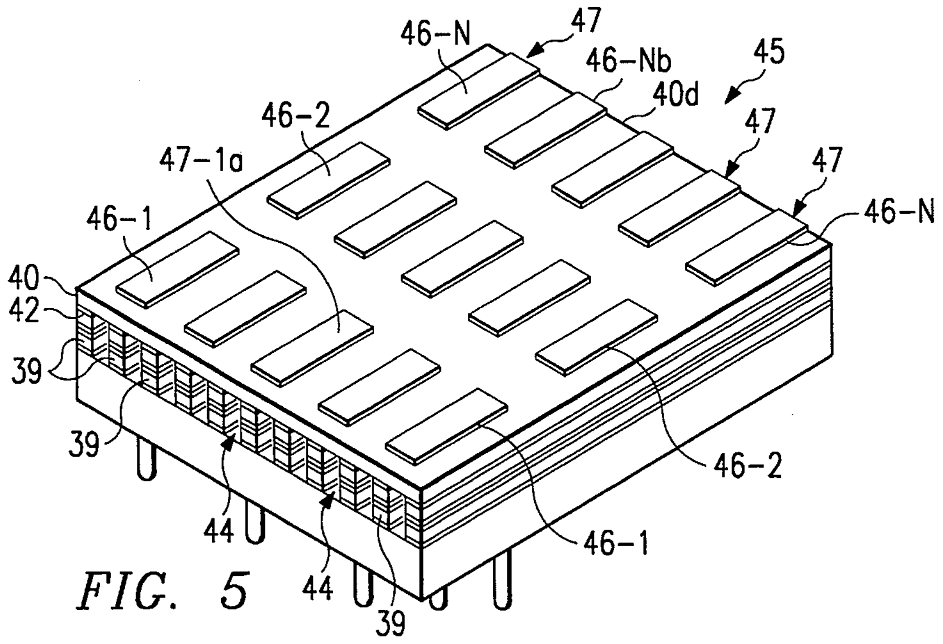
FIG. 5 is a perspective view of the channel array of FIG. 4 after a series of conductive strips have been mounted to a top side surface thereof.

Referring next to FIG. 5, a series of strips 46-1 through 46-N constructed of a conductive material, for example, metal, are formed on the top side surface **40*a* of the upper body portion 40. Preferably, the conductive strips 46-1 through 46-N are formed by a deposition process in which a mask having a series of openings which define the desired pattern of conductive material is placed onto the top side surface 40*a*, A layer of conductive material is then deposited on the top side surface 40*a* and the mask removed to reveal the desired pattern of strips 46-1 through 46-N of conductive material which serve as electrodes for interconnecting the n-type and p-type thermoelectric carriers 50 and 52 with the temperature controller 53. As will be more fully described below, the conductive electrodes 46-1 through 46-2 serve to interconnect the n-type thermoelectric carrier 50 and the p-type thermoelectric carrier 52 forming a thermoelectric carrier pair 49 while the conductive strip 46-N serves to interconnect the thermoelectric carriers to the temperature controller 53. It should be noted that the conductive strips 46-1 through 46-N are thin strips of metal and that the thickness of the conductive strips 46-1 through 46-N relative to the thickness of the upper body portion 40 appears exaggerated in FIG. 5** for ease of illustration.

In the embodiment of the invention described herein, the rows 47 of the conductive strips 46-1 through 46-N are formed on the top side surface **40*a* of the upper body portion 40 after the upper body portion 40 is mounted to the top side surface 30*a* of the second intermediate body portion 30. In an alternate embodiment of the invention, however, it is contemplated that the rows 47 of the conductive strips 46-1 through 46-N are formed on the top side surface 40*a* before assembly of the channel array 45 is completed. Assembly of the channel array 45 is then completed by mounting the upper body portion 40 having the conductive strips 46-1 through 46-N formed thereon to the top side surface 30*a* of the second intermediate body portion 30**.

It should be further noted that, in the embodiment of the invention illustrated in FIG. 5, three electrodes are arranged in each row 47. It is fully contemplated, however, that, in various embodiments thereof, any number of electrodes may be provided in each row. Furthermore, while the length, width and number of conductive strips 46-1 through 46-N to be formed on the top side surface **40*a* will vary depending on the dimensions of the channel array 45 as well as the size and number of thermoelectric carriers 48 to be placed on the top side surface 40*a*, it is specifically contemplated that each conductive strip 46-1 through 46-(N−1) (46-2 in FIG. 5) be sized such that a thermoelectric carrier pair 49 comprised of an n-type thermoelectric carrier 50 and a p-type thermoelectric carrier 52 separated by a small distance may be placed on each conductive strip 46-1 through 46-2. It is further contemplated that each conductive strip 46**-N be sized such that a single n-type thermoelectric carrier may be placed thereon.

The conductive strips 46-1 through 46-N are arranged in a series of longitudinally extending rows 47 generally parallel with each other and separated from an adjacent row by a small distance. While the particular location of each row 47 of conductive strips 46-1 through 46-N relative to the ink-carrying channels 44 and the sidewall actuators 39 of the channel array 45 (see FIG. 9), it is contemplated that each row 47 of conductive strips 46-1 through 46-N is to be positioned along the top side surface **40*a* of the upper body portion immediately above the general center of every other sidewall actuator 39. A leading edge 46-1*a* of the forwardmost conductive strip 46-1 in each row 47 is 30 spaced a small distance from a front edge 40*c* of the top side surface 40*a* while a trailing edge 46-Nb of the rearwardmost conductive strip 46-N in each row 47 extends to a rear edge 40*d* of the top side surface 40*a***.

Figure 6:
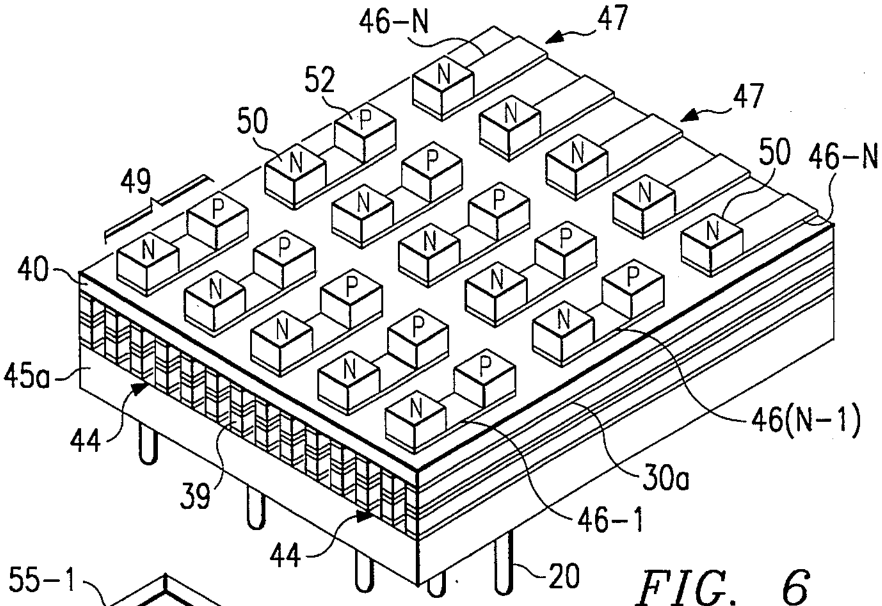
FIG. 6 is a perspective view of the channel array of FIG. 5 after a series of thermoelectric carriers are mounted to the top side surface thereof.

Referring next to FIG. 6, a series of thermoelectric carrier pairs 49 are placed onto the top side surface **40*a* of the upper body portion 40 such that each thermoelectric carrier 50, 52 which comprises a thermoelectric carrier pair 49 is in electrical contact with a single one of the conductive strips 46-1 through 46-2. As may now be seen, each thermoelectric carrier 50, 52 is either an n-type carrier 50 formed of a block of an n-type semiconductor material having more electrons than necessary to complete a perfect molecular lattice structure or a p-type carrier 62 formed of a block of a p-type semiconductor material having insufficient electrons than that necessary to complete a perfect molecular lattice structure. Preferably, the thermoelectric carriers 50, 52 are formed of a good thermoelectric semiconductor material, such as bismuth telluride, which tends to greatly impede conventional heat conduction between high and low temperature areas yet provides an easy flow for the electrons and holes which act as carriers for the n-type and p-type thermoelectric carriers 50 and 52**, respectively.

In the exemplary configuration illustrated in FIG. 6, for each row 47 of conductive strips, an n-type carrier 50 and a p-type carrier 52 is placed on each conductive strip 46-1 through 46-2 (or 46(N−1)) and a single n-type carrier 50 is placed on each conductive strip 46-N. By providing an odd number of carriers in each row 47, one side of temperature controller 53 (see FIG. 8) which, as to be more fully described below, includes a direct current (or "DC") voltage source for controlling the heating or cooling of the channel array 45 is electrically connected to the trailing edge 46-Nb of the rearwardmost conductive strip 46-N in each row 47 of conductive strips formed on the top side surface 40*a* of the upper body portion 40 while the other side of the temperature controller 53 is electrically connected to the cover plate 54 in a manner to be more fully described below.

It should be clearly understood, however, that the use of an equal number of n-type and p-type thermoelectric carriers 50 and 52 is equally suitable for the uses contemplated herein. In this alternate embodiment of the invention, the forwardmost and rearwardmost conductive strips formed on either the top side surface 40*a* or on a bottom side surface 54*b* of the cover plate 54 should respectively extend to the front and rear edge surfaces 40*c* and 40*d* or 54*c* and 54*d*. An equal number of n-type thermoelectric carriers 50 and p-type thermoelectric carriers 52 are placed on the top side surface 40*a* of the upper body portion 40, and both sides of the temperature controller 53 electrically connected to either conductive electrodes formed on the top side surface 40*a* of the upper body portion 40 or to conductive electrodes formed on the cover plate 54.

Both the number of rows 47, the number of thermoelectric carriers 50, 52 in each row 47 and the positioning of the thermoelectric carriers 50, 52 relative to the sidewall actuators 39 and channels 44 is strictly dependent on the dimensions of the channel array 45, the size of the thermoelectric carriers 50, 52 and the desired density of the thermoelectric carriers on the top side surface 40*a* of the upper body portion 40 and that there is no preferred positioning of the carrier elements 50, 52 relative to the sidewall actuators 39 and the channels 44. Generally speaking, however, the greater the density of the carrier elements, the faster the thermoelectric temperature control means 11 will be able to heat or cool the channel array 45 of the ink jet printhead 12. Thus, if an ink jet printhead holds the potential for greater overheating than most, a higher thermoelectric carrier density would appear warranted.

Figure 7:
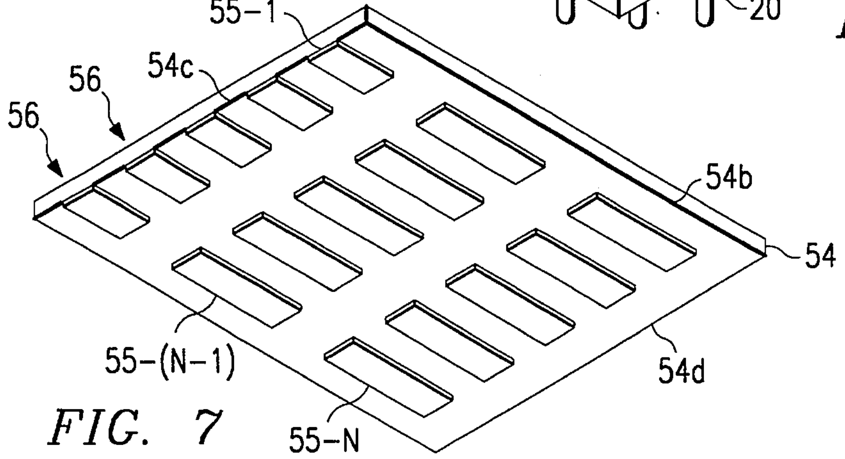
FIG. 7 is a perspective view of a lower side surface of a cover plate for the thermoelectric carriers of FIG. 6.

Referring next to FIG. 7, the cover plate 54 for the thermoelectric temperature control means 11 may now be seen. Preferably, the cover plate 54 is formed of an electrically insulative material characterized by a relatively high heat conductivity. The cover plate 54 includes a lower side surface 54*b* on which a series of conductive strips 55-1 through 55-N are formed thereon. As before, the conductive strips 55-1 through 55-N may be formed using a deposition process in which a mask having a series of openings which define the desired pattern of conductive material is placed onto the bottom side surface 54*b*. A layer of conductive material is deposited on the bottom side surface 54*b* and the mask removed to reveal the desired pattern of strips 55-1 through 55-N of conductive material. As will be more fully described below, the conductive strips 55-2 through 55-N serve as electrodes for interconnecting the p-type thermoelectric carrier 52 of a first thermoelectric carrier pair 49 with the n-type thermoelectric carrier 40 of a second thermoelectric carrier pair while the conductive strips 55-1 serve as electrodes for interconnecting the n-type and p-type thermoelectric carriers 50 and 52 with the temperature controller 53. As before, it should be noted that the conductive strips 55-1 through 55-N are quite thin and that the thickness of the conductive strips 55-1 through 56-N relative to the thickness of the cover plate 54 appears exaggerated in FIG. 7 for ease of illustration.

Also as before, while the length, width and number of conductive strips 55-1 through 55-N to be formed on the bottom side surface 54*b* will vary depending on the size of the channel array 45 and the size and number of thermoelectric carriers 50, 52 to be placed on the top side surface 40*a*, it is preferred that number and arrangement of the conductive strips 55-1 through 55-N be selected to match the number of conductive strips 46-1 through 46-N. Thus, in the embodiment illustrated in FIG. 7, the conductive strips 55-1 through 55-N are arranged in a series of longitudinally extending rows 56, each having three conductive strips 55-1 through 55-N. It is further preferred that the conductive strips 55-1 through 55-N be generally parallel with each other, separated from an adjacent row by a small distance and each one of the rows 56 is positioned in the same plane as a corresponding one of the rows 47. A leading edge 55-1*a* of the forwardmost conductive strip 55-1 in each row 56 extends to a front edge 54*c* of the bottom side surface 54*b* while a trailing edge 55-Nb of the rearwardmost conductive strip 55-N should be spaced a small distance from a rear edge 40*d* of the bottom side surface 54*b*. It is also preferred that each conductive strip 55-1 be sized such that a single n-type thermoelectric carrier 50 is electrically contacted by the conductive strip 55-1 when the cover plate 54 is thermoconductively mounted to the top side surfaces of the thermoelectric carriers 50, 52 and that each conductive strip 55-2 through 55-N be sized such that a p-type thermoelectric carrier 52 included in a first thermoelectric carrier pair 49 and an n-type thermoelectric carrier 50 included in a second thermoelectric carrier pair 49 are electrically connected by each conductive strip 55-2 through 55-N when the cover plate 54 is thermoconductively mounted to the top side surfaces of the n-type and p-type thermoelectric carriers 50 and 52.

Figure 8:
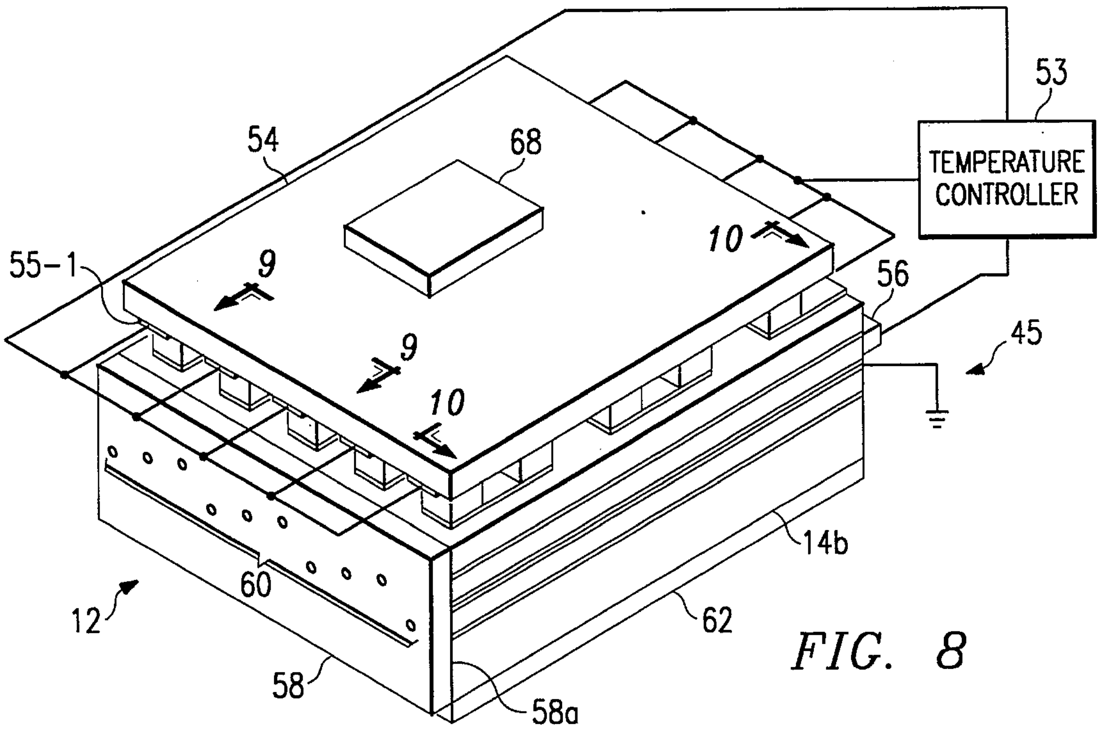
FIG. 8 is a perspective view of a fully assembled ink jet printhead constructed in accordance with the teachings of the present invention and having thermoelectric temperature control means incorporated therein.

Referring next to FIG. 8, a fully assembled ink jet printhead 12 which incorporates the channel array 45 and the thermoelectric temperature control means 11 may now be seen. The cover plate 54 has now been thermoconductively mounted onto top side surfaces of the n-type and p-type thermoelectric carriers 50, 52, such that the first conductive strip 55-1 formed in each row 56 is electrically connected with the forwardmost n-type thermoelectric carrier 50 positioned in each row of thermoelectric carriers while the remaining conductive strips 55-2 through 55-N are electrically connected with the p-type thermoelectric carrier 52 of a first thermoelectric carrier pair 49 in that row and the n-type thermoelectric carrier 50 of a next thermoelectric carrier pair 49 in that row.

In an alternate embodiment of the invention, the thermoelectric control means 11 may be separately assembled before mounted to second intermediate body portion 30 to complete assembly of the channel array 45. More specifically, prior to mounting the upper body portion 40 to the second intermediate body portion 30, the rows 47 of conductive strips 46-1 through 46-N are formed on the top side surface 40*a*, the thermoelectric carriers 50, 52 are placed on the conductive strips 46-1 through 46-N and the cover plate 54 thermoconductively mounted to the top side surfaces of the thermoelectric carriers 50, 52 such that the conductive strips 55-1 through 55-N previously formed on the bottom side surface 54*b* of the cover plate 54 electrically contact the thermoelectric carriers 50, 52 in the manner previously described. In this manner, the thermoelectric control means 11 is assembled first. The upper body portion 40 of the assembled thermoelectric control means 11 is then mounted to the second intermediate body portion 30 to complete assembly of the channel array 45.

To electrically connect the n-type and p-type carriers 50, 52 to the temperature controller 53, the conductive strips 55-1 are tied together and connected to a first side of the temperature controller 53. Similarly, the conductive strips 46-N are tied together and connected to a second side of the temperature controller 53. In this manner, the n-type and p-type carriers 50, 52 are serially connected to the temperature controller 53.

After electrical connection of the thermoelectric temperature control means 11, several final steps are necessary to complete assembly of the ink jet printhead 12. A thermocouple 56 or other temperature monitoring means is mounted onto the channel array 45. For example, the thermocouple 56 may be mounted onto a rear side surface of the upper body portion 40. The thermocouple 56 is electrically coupled to the temperature controller 53 such that the temperature controller 53 powers the thermocouple 56 which, in turn, provides a temperature indication to the temperature controller 53. Ink supply means which, for ease of illustration is not illustrated in FIG. 8 must also be provided. For example, an ink supply may be coupled to the rear side surface of the first and second intermediate body portions 22 and 30 to cover the open rear ends of the ink-carrying channels 44. A back side surface 58*a* of an orifice plate 58 is then mounted to a front side surface 45*a* of the channel array 45 such that each orifice 60 extending through the orifice plate 58 is in communication with a corresponding one of the ink-carrying channels 44 such that, when a channel 44 is compressed by application of a voltage to a sidewall actuator 39 partially defining the channel 44, a droplet of ink will be ejected out of the orifice 60 in communication with the compressed channel 44 shortly thereafter and additional ink from the ink supply will be drawn into the channel 44 from which the ink droplet had been ejected therefrom.

Finally, to electrically connect the ink jet printhead 12 to an associated controller, the layer of conductive material 42 should be electrically connected to ground, as schematically illustrated in FIG. 8, and each pin 20, which, as more fully described below, controls the actuation of a sidewall actuator 39, is electrically connected to a driver capable of selectively applying a positive or negative voltage to the pin 20. For example, a driver board 62 having a plurality of pin-receiving apertures (not shown) for receiving the pins 20 may be snap-mounted onto the bottom side surface 14*b* of the channel array 45. Preferably, the driver board 46 should include a controller (not visible) for issuing control signals to actuate selected ones of the sidewall actuators 39 and a series of switching structures capable of generating a positive or negative voltage at an output thereof in response to instructions issued by the controller. When the driver board 62 is snap-mounted onto the channel array 45, each output of a switching structure should become electrically connected with one of the pins 20. Thus, a snap-in driver board 62 may be used to provide a separate electrical connection to every sidewall actuator 39 for the ink jet printhead 12.

Figure 9:
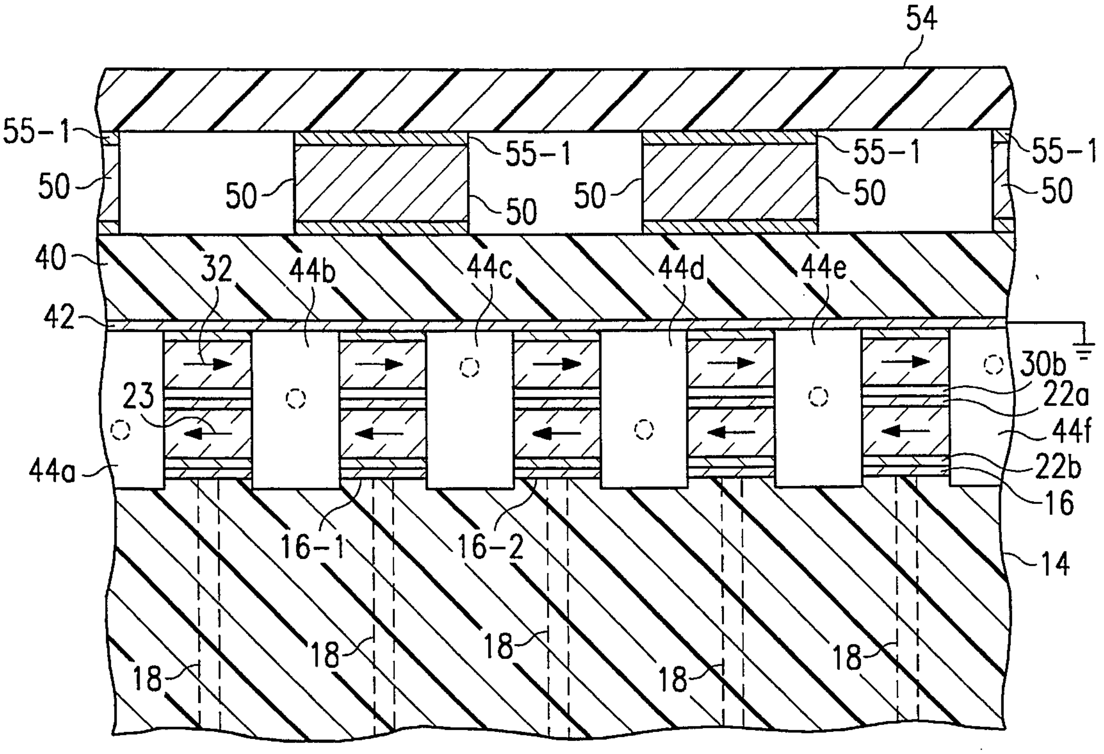
FIG. 9 is an enlarged partial cross-sectional view taken along lines 9—9 of FIG. 8 and illustrating the ink-carrying channels and associated piezoelectric sidewall actuators for the ink jet printhead of FIG. 8.

Referring next to FIG. 9, ink-carrying channels 44*a*–44*f* and the portions of the channel array 45 which define the channels 44*a–f* may now be seen in greater detail. For example, the ink carrying channel 44*c* is defined by a first, longitudinally extending sidewall actuator 39-1 formed by first intermediate portion 22-1 and second intermediate portion 30-1, part of the upper body portion 40, a second sidewall actuator 39-2 formed by first intermediate portion 22-2 and second intermediate portion 30-2 and part of the lower body portion 14. It should be noted that, while the conductive strips 16 have a slightly lesser width than the sidewall actuators 39, for ease of illustration, FIG. 9 illustrates the two has having equal widths.

The method by which a droplet of ink is ejected from a channel, for example, the channel 44*c*, by deflection of the first sidewall actuator 39-1 and the second sidewall actuator 39-2 will now be described in greater detail. To deflect the first sidewall actuator 39-1 into the channel 44*c*, a positive voltage is applied to the conductive strip 16-1 by the associated drive system using the via 18 electrically connected therewith, thereby creating a voltage drop across the intermediate body portions 22-1, 30-1 and ground (conductive layer 42). Because the first intermediate body portion 22-1 is poled in a first direction 23 generally orthogonal to the voltage drop and the second intermediate body portion 30-1 is poled in a second direction 32, opposite to the first direction 23, but also orthogonal to the voltage drop, both the first and second intermediate portions 22-1 and 30-1 will, as illustrated in FIG. 6B, deflect into the channel in shear mode.

Simultaneous with the application of a positive voltage to the conductive strip 16-1, a negative voltage of equal magnitude is applied to the conductive strip 16-2, again using the via 18 connected therewith, to create a voltage drop between ground (conductive layer 42) and the conductive strip 16-2 which is orthogonal to the first and second poling directions 23, 32 of the first and second intermediate body portions 22-2 and 30-2. By reversing the direction of the voltage drop while maintaining the same poling directions 23, 32, the first and second intermediate body portions 22-2 and 30-2 will now deflect in the opposite direction which is again into the channel 44*c*. Of course, the first and second intermediate portions 22-1 and 30-1 may be deflected into the channel 44*b* and the first and second intermediate portions 22-2 and 30-2 may be deflected into the channel 44*d* by applying negative and positive voltages, respectively, at the conductive strips 16-1 and 16-2. For example, suitable positive and negative voltages to cause the deflection of a sidewall actuator 39 into an ink-carrying channel 40 are +40 and −40 volts.

In the embodiment illustrated in FIG. 9, the thermoelectric carriers 50 are regularly spaced such a thermoelectric carrier is generally aligned with the general center of every other one of the sidewall actuators 39. Again, it should be clearly understood that the positioning of the thermoelectric carriers 50, 52, as well as the separation between adjacent thermoelectric carriers 50, 52 will vary depending on the relative sizes of the thermoelectric carriers 50, 52 and the sidewall actuators 39 of the printhead 12 as well as on the desired heating/cooling capability of the thermoelectric temperature control means 11.

Figure 10:
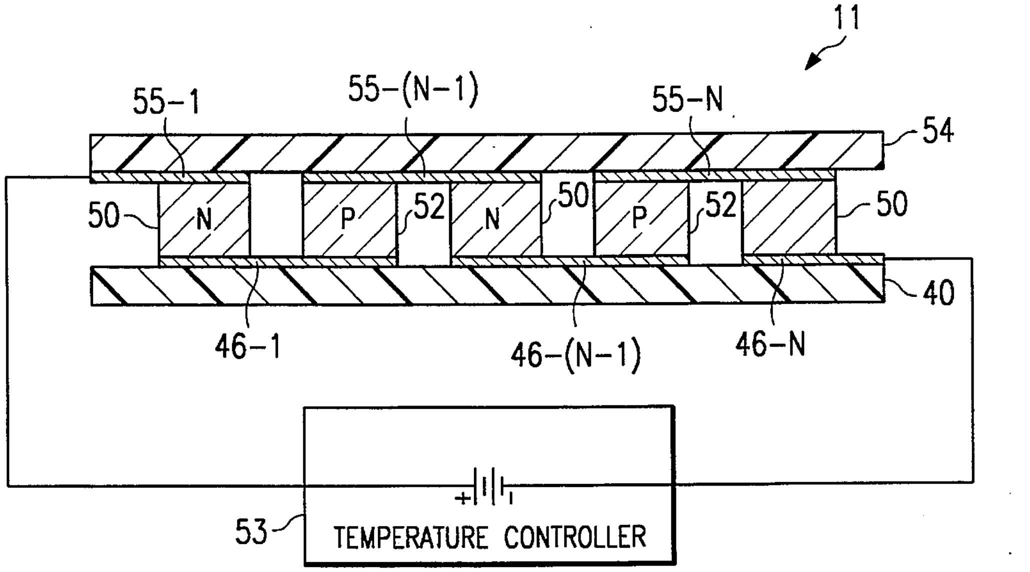
FIG. 10 is an enlarged cross-sectional view taken along lines 10—10 of FIG. 8 and illustrating the thermoelectric carriers of FIG. 8.

Referring next to FIG. 10, the operation of the thermoelectric temperature control means 11 will now be described in greater detail. As previously stated, the thermoelectric temperature control means 11 is comprised of a plurality of alternating n-type and p-type thermoelectric carriers 50 and 52 serially connected to the DC voltage source included as part of the temperature controller 53. It should be noted that, in the embodiment illustrated in FIGS. 5–10, the thermoelectric temperature control means 11 is arranged as a series of rows of thermoelectric carriers 50 and 52 connected in serial with the temperature controller 53 and in parallel with the remaining rows of thermoelectric carriers 50 and 52. It is contemplated, however, that in an alternate embodiment of the invention, only the forwardmost conductive strip 46-1 in a first row of thermoelectric carriers 50, 52 and the rearwardmost conductive strip 55-N in a last row of thermoelectric carriers 50, 52 are respectively connected to the first and second sides of the temperature controller 53 and that each row of thermoelectric carriers 50, 52 is connected in serial to an adjacent row. In this alternate embodiment, the desired degree of heating or cooling of the channel array 45 may be accomplished at a lower current but a higher voltage than the embodiment of the invention illustrated in FIGS. 5–10.

During operational, i.e. ink ejection, and rest periods, the temperature of the channel array 45 is continuously monitored by the thermocouple 56 and the monitored temperature transmitted to the temperature controller 53. The temperature controller 53 includes logical circuitry (not shown) for determining whether the monitored temperature is within a predetermined temperature range. As long as the monitored temperature remains within this range, the thermoelectric temperature control means 11 remains inactive. If, however, the monitored temperature strays outside of the range, the temperature controller 53 will apply a DC voltage to the thermoelectric carriers 50, 52 to selectively heat or cool the channel array 45.

More specifically, if the temperature of the channel array 45 rises above the predetermined temperature range, the temperature controller will cool the channel array 45 by applying a positive voltage of a selected magnitude to the electrodes 55-1 and a negative voltage to the electrodes 46-N. By applying voltage in this manner, electron carriers contained in the n-type thermoelectric carriers 50 and hole carriers contained in the p-type will transfer heat from the upper body portion 40 to the cover plate 54. Furthermore, as the upper body portion 40 is thermally coupled directly to the ink contained in the ink-carrying channels 44 and the intermediate body portion 30 as well as being indirectly thermally coupled to the intermediate body portion 22 and the lower body portion 14, the transfer of heat from the upper body portion 40 to the cover plate 54 will effect a general cooling of the entire channel array 45 and the ink contained therein.

If, however, the thermocouple 56 detects that the temperature of the channel array 45 has dropped below the predetermined operating range, the temperature controller 53 will heat the channel array 45 by applying a negative voltage of a selected magnitude to the electrodes 55-1 and a positive voltage to the electrodes 46-N. By applying voltage in this manner, the electron and hole carriers respectively contained in the n-type and p-type thermoelectric carriers 50 and 52 will transfer heat from the cover plate 54 to the upper body portion 40. Again, as the upper body portion 40 is either directly or indirectly thermally coupled to the ink contained in the ink-carrying channels 44, the intermediate body portions 22 and 30 and the lower body portion 14, the transfer of heat from the cover plate 54 to the upper body portion 40 will effect a general heating of the entire channel array 45 and the ink contained therein.

Proper heat dissipation is a concern for thermoelectric temperature control devices such as that disclosed herein. More specifically, thermoelectric temperature control devices selectively heat or cool by the transfer of heat between first and second locations. If, however, the heat transferred thereby is not properly dissipated, the ability of a thermoelectric temperature control device to selectively heat or cool an object may be severely degraded. As the temperature changes resulting from the operation of most ink jet printheads occur within a relatively small temperature range, it is contemplated that the drop-on-demand ink jet printhead 12 having the thermoelectric temperature control means 11 herein described is suitable for controlling the operating temperature of the ink jet printhead 12 under typical operating conditions. Under typical operating conditions, normal cooling of the cover plate 54 due to heat convection will cool the cover plate 54 sufficiently such that a buildup of heat which would degrade the performance of the thermoelectric temperature control means 11 will not occur. However, if it is desired for the thermoelectric temperature control means 11 to regulate larger temperature variations, for example, those temperature variations caused by the use of phase change ink, the ability of the thermoelectric temperature control means 11 to dissipate heat transferred thereto should be enhanced. For example, a conventionally designed heat sink 68 may be mounted to the top side surface of the cover plate 54.

Thus, there has been described and illustrated herein, an ink jet printhead having thermoelectric temperature control means for selectively heating and cooling a channel array portion thereof and a method of manufacturing the same. However, those skilled in the art will recognize that many modifications and variations besides those specifically mentioned may be made in the techniques described herein without departing substantially from the concept of the present invention. Accordingly, it should be clearly understood that the form of the invention as described herein is exemplary only and is not intended as a limitation on the scope of the invention.

What is claimed is:

1. A method of manufacturing a drop-on-demand ink jet printhead, comprising the steps of:

providing a channel array constructed of a thermally conductive material, said channel array having a top side surface, a front side surface, a spaced series of internal ink-carrying channels which extend rearwardly from said front side surface and piezoelectric actuation means acoustically coupled to each of said ink-carrying channels for selectively imparting pressure pulses thereto; and mounting thermoelectric temperature control means to said top side surface of said channel array;

said thermoelectric temperature control means including means for heating and cooling said channel array.

2. A method of manufacturing a drop-on-demand ink jet printhead according to claim 1 wherein the step of mounting thermoelectric temperature control means to said top side surface of said channel array further comprises the steps of:

providing a plurality of n-type and p-type thermoelectric carriers, each of said n-type and p-type thermoelectric carriers having top and bottom side surfaces;

thermoconductively mounting said bottom side surface of each one of said plurality of n-type and p-type thermoelectric carriers to said top side surface of said channel array;

thermoconductively mounting a bottom side surface of a cover plate to said top side surface of each one of said plurality of n-type and p-type thermoelectric carriers, said cover plate constructed of a thermally conductive material and thermally connected in parallel with said channel array; and serially connecting said plurality of n-type and p-type thermoelectric carriers to a power source such that application of a first current causes said plurality of n-type and p-type thermoelectric carriers to cool said channel array by transferring heat from said channel array to said heat conductive cover and application of a second, reverse, current causes said plurality of n-type and p-type thermoelectric carriers to heat said channel array by transferring heat from said cover plate to said channel array.

3. A method of manufacturing a drop-on-demand ink jet printhead according to claim 2 wherein the step of thermoconductively mounting said bottom side surface of each one of said plurality of n-type and p-type thermoelectric carriers to said top side surface of said channel array further comprises the steps of:

forming a first plurality of electrodes on said top side surface of said channel array; and electrically connecting an n-type thermoelectric carrier and a p-type thermoelectric carrier with each one of said first plurality of electrodes.

4. A method of manufacturing a drop-on-demand ink jet printhead according to claim 3 wherein the step of thermoconductively mounting a bottom side surface of a cover plate to said top side surface of each one of said plurality of n-type and p-type thermoelectric carriers further comprises the steps of:

forming a second plurality of electrodes on said bottom side surface of said cover plate; and electrically connecting each one of said second plurality of electrodes with an n-type thermoelectric carrier and a p-type thermoelectric carrier.

5. A method of manufacturing a drop-on-demand ink jet printhead according to claim 4 and further comprising the steps of:

forming a third plurality of electrodes on said top side surface of said channel array, said third plurality of electrodes extending to a rear edge of said top side surface;

thermoconductively mounting a second plurality of thermoelectric carriers on said top side surface such that a single one of said second plurality of thermoelectric carriers is electrically connected with one of said third plurality of electrodes; and electrically connecting said third plurality of electrodes to said power source.

6. A method of manufacturing a drop-on-demand ink jet printhead according to claim 5 and further comprising the steps of:

forming a fourth plurality of electrodes on said bottom side surface of said cover plate, said fourth plurality of electrodes extending to a front edge of said bottom side surface;

electrically connecting each one of said fourth plurality of electrodes with a single thermoelectric carrier; and electrically connecting said fourth plurality of electrodes to said power source.

7. A method of manufacturing a drop-on-demand ink jet printhead according to claim 6 and further comprising the steps:

mounting a thermocouple to said channel array; and electrically connecting said thermocouple to said power source;

wherein said power source selectively applies said first or second current to selectively cool or heat said channel array based upon said channel array's temperature as determined by said thermocouple.

8. A method of manufacturing a drop-on-demand ink jet printhead according to claim 2 and further comprising the steps of:

forming a first plurality of electrodes on said top side surface of said channel array, said first plurality of electrodes arranged in a first series of generally parallel rows which extend across said top side surface, a first electrode in each of said rows having a leading edge spaced a first distance from a front edge of said top side surface and a last electrode in each of said rows extending to a rear edge of said top side surface;

electrically connecting a plurality of n-type and p-type thermoelectric carrier pairs with corresponding ones of said first plurality of electrodes other than said last electrode in each of said rows such that, for each of said rows, said n-type and p-type thermoelectric carrier pairs are arranged in an alternating pattern;

electrically connecting a single thermoelectric carrier with said last electrode in each of said rows;

forming a second plurality of electrodes on said bottom side surface of said cover plate, said second plurality of electrodes arranged in a second series of generally parallel rows which extend across said bottom side surface, a first electrode in each of said rows of said second series of rows extending to a front edge of said bottom side surface and a last electrode in each of said rows of said second series of rows having a trailing edge spaced a second distance from a rear edge of said bottom side surface;

electrically connecting each one of said second plurality of electrodes other than said first electrode in each of said second series of rows with an n-type thermoelectric carrier of a first n-type and p-type thermoelectric carrier pair and a p-type thermoelectric carrier of a second n-type and p-type thermoelectric carrier pair arranged in one of said rows of said first series of rows; and electrically connecting said first electrode in each of said rows of said second series of rows with a single thermoelectric carrier of one of said n-type and p-type thermoelectric carrier pairs arranged in one of said rows of said first series of rows.

9. A method of manufacturing a drop-on-demand ink jet printhead according to claim 8 and further comprising the steps of:

electrically connecting said electrodes formed on said top side surface of said channel array which extend to said rear edge thereof to a first side of said power source; and electrically connecting said electrodes formed on said bottom side surface of said cover plate which extend to said front edge thereof to a second side of said power source.

10. A method of manufacturing a drop-on-demand ink jet printhead according to claim 9 and further comprising the steps of:

mounting a thermocouple to said channel array; and electrically connecting said thermocouple to said power source;

wherein said power source selectively applies said first or second current to cool or heat said channel array based upon said channel array's temperature as determined by said thermocouple.

11. A method of manufacturing a drop-on-demand ink jet printhead, comprising the steps of:

providing a lower body portion formed of an insulative material and having top and bottom side surfaces, a plurality of generally parallel, longitudinally extending strips of conductive material formed along said top side surface, a corresponding plurality of conductive pins projecting from said bottom side surface and means for electrically connecting each of said plurality of pins with a corresponding one of said plurality of strips;

electroconductively and thermoconductively mounting a bottom side surface of a first intermediate body portion to said top side surface of said lower body portion, said first intermediate body portion constructed of an active piezoelectric material poled in a first direction generally parallel to said lower body portion;

electroconductively and thermoconductively mounting a bottom side surface of a second intermediate body portion to a top side surface of said first intermediate body portion, said second intermediate body portion constructed of an active piezoelectric material poled in a second direction, opposite to said first direction, generally parallel to said lower body portion;

forming, at spaced locations along a top side surface of said second intermediate body portion, a plurality of generally parallel, longitudinally extending grooves which extend through said first and second intermediate body portion to expose generally parallel, longitudinally extending portions of said top side surface of said lower body portion located between said strips of conductive material;

electroconductively and thermoconductively mounting a bottom side surface of an upper body portion to said top side surface of said second intermediate body portion, said upper body portion formed of an insulative material; and mounting thermoelectric temperature control means to a top side surface of said upper body portion;

said thermoelectric temperature control means including means for heating and cooling said lower, first intermediate, second intermediate and upper body portions.

12. A method of manufacturing a drop-on-demand ink jet printhead according to claim 11 wherein the step of mounting thermoelectric temperature control means to said top side surface of said upper body portion further comprises the steps of:

providing a plurality of n-type and p-type thermoelectric carriers, each of said n-type and p-type thermoelectric carriers having top and bottom side surfaces;

thermoconductively mounting said bottom side surface of each one of said plurality of n-type and p-type thermoelectric carriers to said top side surface of said upper body portion;

thermoconductively mounting a bottom side surface of a cover plate to said top side surface of each one of said plurality of n-type and p-type thermoelectric carriers, said cover plate constructed of a thermally conductive material and thermally connected in parallel with said upper body portion; and serially connecting said plurality of n-type and p-type thermoelectric carriers to a power source such that application of a first current causes said plurality of n-type thermoelectric carriers to cool said upper body portion by transferring heat from said upper body portion to said cover plate and application of a second, reverse, current causes said plurality of n-type and p-type thermoelectric carriers to heat said upper body portion by transferring heat from said cover plate to said upper body portion.

13. A method of manufacturing a drop-on-demand ink jet printhead according to claim 12 and further comprising the steps of:

forming a first plurality of electrodes on said top side surface of said upper body portion, said first plurality of electrodes arranged in a first series of generally parallel rows which extend across said top side surface, a first electrode in each of said rows having a leading edge spaced a first distance from a front edge of said top side surface and a last electrode in each of said rows extending to a rear edge of said top side surface;

electrically connecting a plurality of n-type and p-type thermoelectric carrier pairs with corresponding ones of said first plurality of electrodes other than said last electrode in each of said rows such that, for each of said rows, said n-type and p-type thermoelectric carrier pairs are arranged in an alternating pattern;

electrically connecting a single thermoelectric carrier with said last electrode in each of said rows;

forming a second plurality of electrodes on a bottom side surface of said cover plate, said second plurality of electrodes arranged in a second series of generally parallel rows which extend across said bottom side surface, a first electrode in each of said rows of said second series extending to a front edge of said bottom side surface and a last electrode in each of said rows of said second series having a trailing edge spaced a second distance away from said rear edge of said bottom side surface;

electrically connecting each one of said second plurality of electrodes other than said first electrode in each of said second series of rows with an n-type thermoelectric carrier of a first n-type and p-type thermoelectric carrier pair and a p-type thermoelectric carrier of a second n-type and p-type thermoelectric carrier pair arranged in one of said rows of said first series of rows; and electrically connecting said first electrode in each of said rows of said second series of rows with a single thermoelectric carrier of one of said n-type and p-type thermoelectric carrier pairs arranged in one of said rows of said first series of rows.

14. A method of manufacturing a drop-on-demand ink jet printhead according to claim 13 and further comprising the steps of:

mounting a thermocouple to said upper body portion; and electrically connecting said thermocouple to said power source;

wherein said power source selectively applies said first or second current to cool or heat said upper body portion based upon said upper body portion's temperature as determined by said thermocouple.

15. A method of manufacturing a drop-on-demand ink jet printhead according to claim 14 and further comprising the step of mounting a controller for controlling the application of electrical pulses to said piezoelectric actuation means to said plurality of conductive pins projecting from said bottom side surface of said lower body portion.

16. A method of manufacturing a drop-on-demand ink jet printhead, comprising the steps of:

providing lower and upper body portions of a channel array, said lower body portion constructed of a thermally conductive material and having a top side surface, a front side surface, a spaced series of grooves which extend rearwardly from said front side surface and downwardly from said top side surface and said upper body portion constructed of a thermally conductive material and having bottom, top and front side surfaces;

mounting thermoelectric temperature control means to said top side surface of said upper body portion; and mounting said bottom side surface of said upper body portion to said top side surface of said lower body portion to form a channel array having a spaced series of internal ink-carrying channels which extend rearwardly from said front side surfaces of said lower and upper body portions;

said thermoelectric temperature control means including means for heating and cooling said channel array.

17. A method of manufacturing a drop-on-demand ink jet printhead according to claim 16 wherein the step of mounting thermoelectric temperature control means to said top side surface of said upper body portion further comprises the steps of:

providing a plurality of n-type and p-type thermoelectric carriers, each of said n-type and p-type thermoelectric carriers having top and bottom side surfaces;

thermoconductively mounting said bottom side surface of each one of said plurality of n-type and p-type thermoelectric carriers to said top side surface of said upper body portion; and thermoconductively mounting a bottom side surface of a cover plate to said top side surface of each one of said plurality of n-type and p-type thermoelectric carriers, said cover plate constructed of a thermally conductive material and thermally connected in parallel with said upper body portion.

18. A method of manufacturing a drop-on-demand ink jet printhead according to claim 17 wherein the step of thermoconductively mounting said bottom side surface of each one of said plurality of n-type and p-type thermoelectric carriers to said top side surface of said upper body portion further comprises the steps of:

forming a first plurality of electrodes on said top side surface of said upper body portion; and electrically connecting an n-type thermoelectric carrier and a p-type thermoelectric carrier with each one of said first plurality of electrodes.

19. A method of manufacturing a drop-on-demand ink jet printhead according to claim 18 wherein the step of thermoconductively mounting a bottom side surface of a cover plate to said top side surface of each one of said plurality of n-type and p-type thermoelectric carriers further comprises the steps of:

forming a second plurality of electrodes on said bottom side surface of said cover plate; and electrically connecting each one of said second plurality of electrodes with an n-type thermoelectric carrier and a p-type thermoelectric carrier.

20. A method of manufacturing a drop-on-demand ink jet printhead according to claim 19 and further comprising the step of serially connecting said plurality of n-type and p-type thermoelectric carriers to a power source such that application of a first current causes said plurality of n-type and p-type thermoelectric carriers to cool said channel array by transferring heat from said channel array to said heat conductive cover and application of a second, reverse, current causes said plurality of n-type and p-type thermoelectric carriers to heat said channel array by transferring heat from said cover plate to said channel array.

21. A method of manufacturing a drop-on-demand ink jet printhead according to claim 20 and further comprising the steps of:

forming a third plurality of electrodes on said top side surface of said channel array, said third plurality of electrodes extending to a rear edge of said top side surface;

thermoconductively mounting a second plurality of thermoelectric carriers on said top side surface such that a single one of said second plurality of thermoelectric carriers is electrically connected with one of said third plurality of electrodes; and electrically connecting said third plurality of electrodes to said power source.

22. A method of manufacturing a drop-on-demand ink jet printhead according to claim 21 and further comprising the steps of:

forming a fourth plurality of electrodes on said bottom side surface of said cover plate, said fourth plurality of electrodes extending to a front edge of said bottom side surface;

electrically connecting each one of said fourth plurality of electrodes with a single thermoelectric carrier; and electrically connecting said fourth plurality of electrodes to said power source.

23. A method of manufacturing a drop-on-demand ink jet printhead, comprising the steps of:

providing lower and upper body portions of a channel array, said lower body portion constructed of a thermally conductive material and having a top side surface, a front side surface, a series of grooves which extend rearwardly from said front side surface and downwardly from said top side surface and said upper body portion constructed of a thermally conductive material and having bottom, top and front side surfaces;

forming a first plurality of electrodes on said top side surface of said upper body portion;

mounting said bottom side surface of said upper body portion to said top side surface of said lower body portion to form a channel array having a spaced series of internal ink-carrying channels which extend rearwardly from said front side surfaces of said lower and upper body portions; and mounting thermoelectric temperature control means to said top side surface of said upper body portion, said thermoelectric temperature control means electrically connected with said first plurality of electrodes;

said thermoelectric temperature control means including means for heating and cooling said channel array.

24. A method of manufacturing a drop-on-demand ink jet printhead according to claim 23 wherein the step of mounting thermoelectric temperature control means to said top side surface of said upper body portion to electrically connect said thermoelectric temperature control means with said first plurality of electrodes further comprises the steps of:

providing a plurality of n-type and p-type thermoelectric carriers, each of said n-type and p-type thermoelectric carriers having top and bottom side surfaces;

thermoconductively mounting said bottom side surface of each one of said plurality of n-type and p-type thermoelectric carriers to said top side surface of said upper body portion such that an n-type thermoelectric carrier and a p-type thermoelectric carrier are electrically connected with each one of said first plurality of electrodes;

thermoconductively mounting a bottom side surface of a cover plate to said top side surface of each one of said plurality of n-type and p-type thermoelectric carriers, said cover plate constructed of a thermally conductive material and thermally connected in parallel with said channel array; and serially connecting said plurality of n-type and p-type thermoelectric carriers to a power source such that application of a first current causes said plurality of n-type and p-type thermoelectric carriers to cool said channel array by transferring heat from said channel array to said heat conductive cover and application of a second, reverse, current causes said plurality of n-type and p-type thermoelectric carriers to heat said channel array by transferring heat from said cover plate to said channel array.

25. A method of manufacturing a drop-on-demand ink jet printhead according to claim 24 wherein the step of thermoconductively mounting a bottom side surface of a cover plate to said top side surface of each one of said plurality of n-type and p-type thermoelectric carriers further comprises the steps of:

forming a second plurality of electrodes on said bottom side surface of said cover plate; and electrically connecting each one of said second plurality of electrodes with an n-type thermoelectric carrier and a p-type thermoelectric carrier.

26. A method of manufacturing a drop-on-demand ink jet printhead according to claim 25 and further comprising the steps of:

forming a third plurality of electrodes on said top side surface of said upper body portion prior to mounting said upper body portion to said lower body portion, said third plurality of electrodes extending to a rear edge of said top side surface;

thermoconductively mounting a second plurality of thermoelectric carriers on said top side surface such that a single one of said second plurality of thermoelectric carriers is electrically connected with one of said third plurality of electrodes; and electrically connecting said third plurality of electrodes to said power source.

27. A method of manufacturing a drop-on-demand ink jet printhead according to claim 26 and further comprising the steps of:

forming a fourth plurality of electrodes on said bottom side surface of said cover plate, said fourth plurality of electrodes extending to a front edge of said bottom side surface;

electrically connecting each one of said fourth plurality of electrodes with a single thermoelectric carrier; and electrically connecting said fourth plurality of electrodes to said power source.

* * * * *